(12) United States Patent
Komachi

(10) Patent No.: US 8,921,215 B2
(45) Date of Patent: Dec. 30, 2014

(54) ION INJECTION SIMULATION METHOD, ION INJECTION SIMULATION DEVICE, METHOD OF PRODUCING SEMICONDUCTOR DEVICE, AND METHOD OF DESIGNING SEMICONDUCTOR DEVICE

(75) Inventor: Jun Komachi, Kanagawa (JP)

(73) Assignee: Sony Corporation, Tokyo (JP)

( * ) Notice: Subject to any disclaimer, the term of this patent is extended or adjusted under 35 U.S.C. 154(b) by 290 days.

(21) Appl. No.: 13/416,462

(22) Filed: Mar. 9, 2012

(65) Prior Publication Data

US 2012/0276723 A1 Nov. 1, 2012

(30) Foreign Application Priority Data

Mar. 11, 2011 (JP) ................................. 2011-054703
Dec. 27, 2011 (JP) ................................. 2011-286252

(51) Int. Cl.
*H01L 21/425* (2006.01)
*H01L 21/265* (2006.01)

(52) U.S. Cl.
CPC .... *H01L 21/26513* (2013.01); *H01L 21/26586* (2013.01)
USPC ............ 438/514; 257/E21.334; 257/E21.473; 703/1; 703/2

(58) Field of Classification Search
CPC .................... H01L 21/26513; H01L 21/26586
USPC ........ 257/E21.334, E21.473; 438/514; 703/1, 703/2
See application file for complete search history.

(56) References Cited

U.S. PATENT DOCUMENTS

| 6,313,648 | B1 * | 11/2001 | Syo ................................ 324/719 |
| 6,358,799 | B2 * | 3/2002 | Odanaka et al. .............. 438/267 |
| 6,366,873 | B1 * | 4/2002 | Beardmore et al. ............ 703/13 |
| 7,488,672 | B2 * | 2/2009 | Kim ................................ 438/514 |
| 8,350,365 | B1 * | 1/2013 | Wu et al. ....................... 257/632 |
| 2007/0026544 | A1 * | 2/2007 | Tsuno ............................ 438/14 |

FOREIGN PATENT DOCUMENTS

JP 2008-177518 7/2008

OTHER PUBLICATIONS

Changhae Park et al.; Efficient Modeling Parameter Extraction for Dual Pearson Approach to Simulation of Implanted Purity Profiles in Silicon; Solid-State Electronics; vol. 33, No. 6, pp. 645-650; 1990.

* cited by examiner

*Primary Examiner* — Bac Au
(74) *Attorney, Agent, or Firm* — Dentons US LLP

(57) ABSTRACT

An ion injection simulation method includes: calculating a reinjection dose injected into a substrate and a structure formed on the substrate and reinjected from a side face of the structure; and calculating concentration distribution of impurities injected into the substrate from a distribution function and reinjection conditions of the reinjection dose.

10 Claims, 12 Drawing Sheets

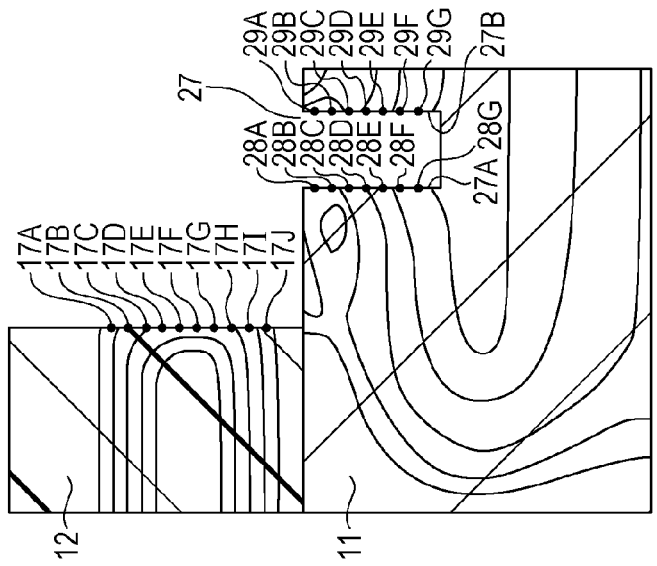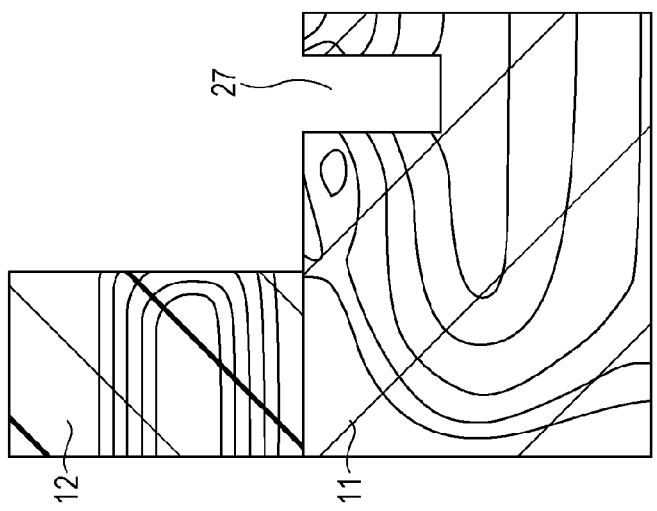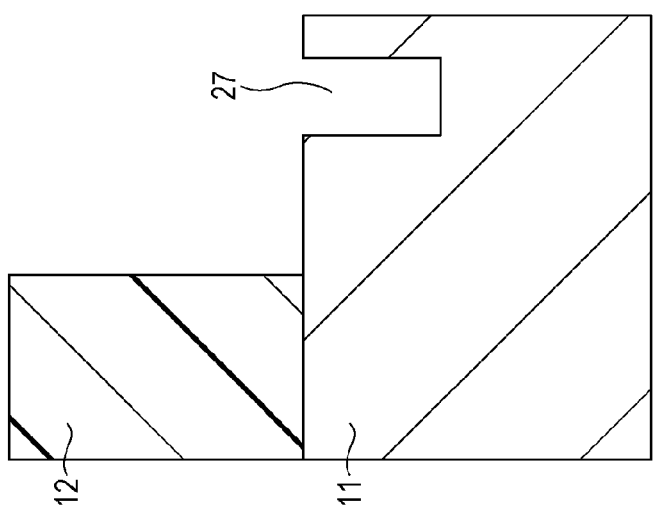

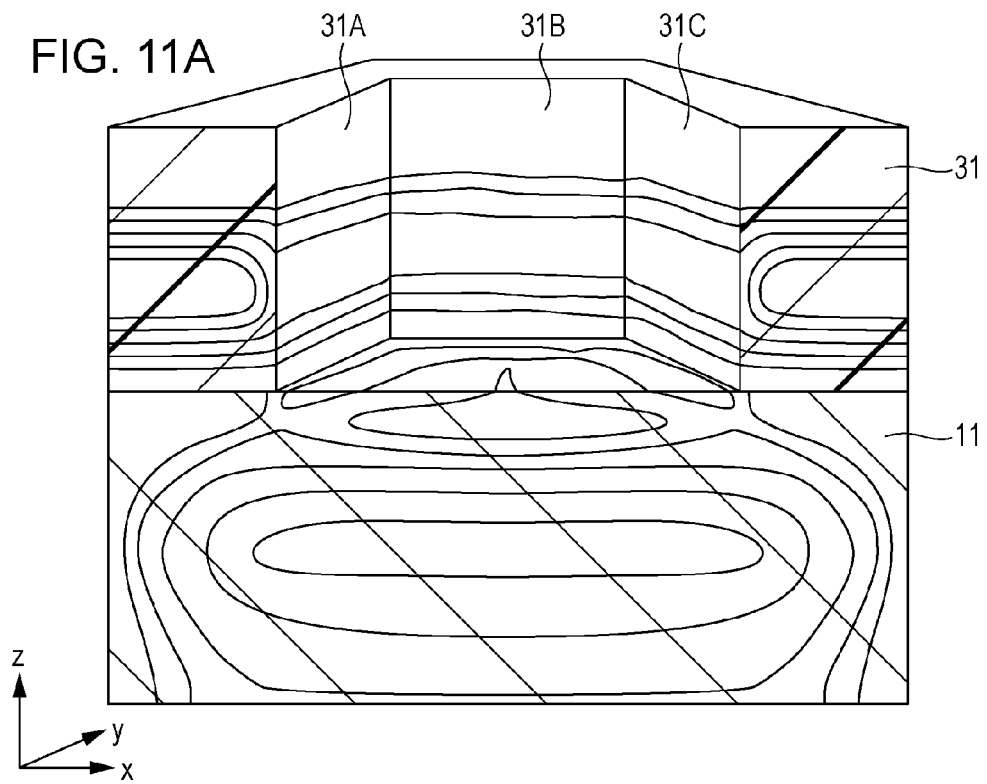
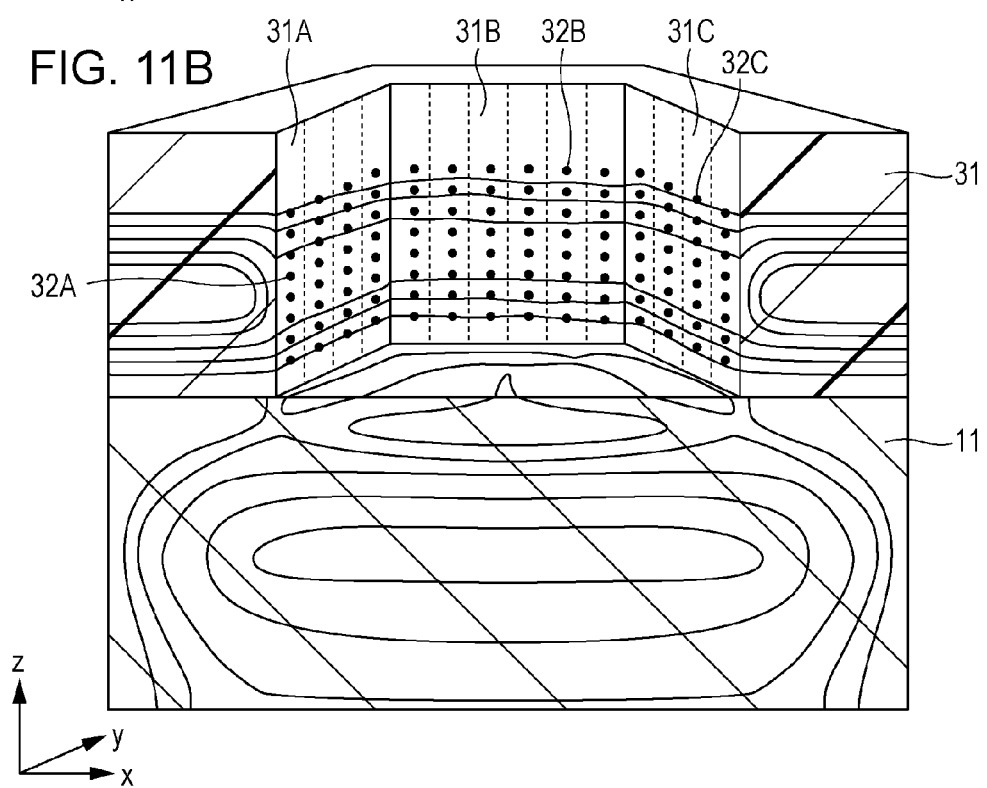

ION INJECTION SIMULATION METHOD, ION INJECTION SIMULATION DEVICE, METHOD OF PRODUCING SEMICONDUCTOR DEVICE, AND METHOD OF DESIGNING SEMICONDUCTOR DEVICE

BACKGROUND

The present disclosure relates to an ion injection simulation method based on a well proximity effect, an ion injection simulation device, a method of producing a semiconductor device, and a method of designing a semiconductor device.

As a simulation method of an ion injection process used in a process of producing a semiconductor device, an analytical model is used. In the analytical model, impurity concentration distribution based on ion injection is approximated using a distribution function such as a dual-Pearson IV type function (for example, see Changhae Parka, Kevin M. Kleina and Al F. Tascha, "Efficient modeling parameter extraction for dual Pearson approach to simulation of implanted impurity profiles in silicon", Solid-State Electronics, Volume 33, Issue 6, June 1990, Pages 645-650).

In the process of producing the semiconductor device, high energy and a large amount of ions are necessary in a well forming process. For this reason, of the thickness of a mask resist for preventing ion injection increases. The ions injected into the mask resist at the time of well forming are dispersed in the resist. Particularly, there is possibility that the ions appear from a side face of the mask resist by the dispersion of the ions in the transverse direction. For this reason, in an area of a substrate which is not covered with the resist, unintended impurity distribution is formed by the appearance of the ions from the side face of the mask resist. This is a primary factor in causing fluctuations in a device such as a threshold value of a transistor. This phenomenon is called a well proximity effect.

In the production of a semiconductor device, it is proposed to optimize a design of a device to alleviate fluctuations in a device caused by the well proximity effect described above (for example, see Japanese Unexamined Patent Application Publication No. 2008-177518).

SUMMARY

In the production of a semiconductor device, it is preferable to suppress the influence caused by the well proximity effect. For this reason, a simple calculation method of impurity distribution caused by ion injection is preferable.

It is desirable to provide a simple ion injection simulation method for the well proximity effect.

According to an embodiment of the present disclosure, there is provided an ion injection simulation method including: calculating a reinjection dose reinjected from a side face of a structure to a substrate after being injected into the substrate and the structure formed on the substrate; and calculating concentration distribution of impurities injected into the substrate from a distribution function and the reinjection conditions of the reinjection dose.

According to another embodiment of the present disclosure, there is provided an ion injection simulation device including: a storage unit that stores a distribution function and parameters; and a calculation unit that calculates concentration distribution, in a substrate, of impurities reinjected from a side face of a structure to a substrate in the substrate after being injected into the structure formed on the substrate using the distribution function and the parameters stored in the storage unit.

According to still another embodiment of the present disclosure, there is provided a method of producing a semiconductor device, the method including: forming a pattern of a structure on a semiconductor substrate; and injecting ions from the structure to the semiconductor substrate. In the ion injection process, a reinjection dose reinjected from a side face of the structure to the substrate after being injected into the structure is calculated to generate the reinjection conditions. Furthermore, ion injection simulation of calculating concentration distribution of impurities injected into the substrate from the reinjection conditions of the reinjection dose and the distribution function is performed. In this manner, ion injection is performed on the semiconductor substrate based on the conditions generated by the ion injection simulation.

According to still another embodiment of the present disclosure, there is provided a method of designing a semiconductor device, the method including: calculating a reinjection dose reinjected from a side face of a structure to a substrate after being injected into the structure formed on a semiconductor substrate and to generate reinjection conditions; and calculating concentration distribution of impurities of the semiconductor substrate by ion injection simulation of calculating concentration distribution of impurities injected into the substrate from the distribution function and the reinjection conditions of the reinjection dose.

In the ion injection simulation method and the ion injection simulation device according to the embodiments of the present disclosure, the simulation is performed on a model in which a portion of the impurities injected into the structure 11 formed on the substrate are reinjected from the structure to the substrate. In the reinjection dose reinjected from the structure to the substrate, the impurity concentration distribution in the substrate is calculated by simulation on the basis of the analytical model using the distribution function. The semiconductor device is designed on the basis of the ion injection conditions generated by the ion injection simulation to produce the semiconductor device.

According to the present disclosure, it is possible to perform simulation of a well proximity effect by a simple method based on an analytical model.

BRIEF DESCRIPTION OF THE DRAWINGS

FIG. 10A is a diagram illustrating a structure applied to ion injection simulation, FIG. 10B is a diagram illustrating impurity concentration distribution based on ion injection simulation, and FIG. 10C is a diagram illustrating a reinjection start point based on ion injection simulation.

FIG. 11A is a diagram illustrating impurity concentration distribution based on ion injection simulation, and FIG. 11B is a diagram illustrating a reinjection start point based on ion injection simulation.

DETAILED DESCRIPTION OF EMBODIMENTS

Hereinafter, examples of preferred embodiments of the present disclosure will be described, but the present disclosure is not limited to the following examples.

The description takes the following order.
1. Outline of Ion Injection Simulation Method
2. Embodiment of Ion Injection Simulation Method
3. Embodiment of Ion Injection Simulation Device
<1. Outline of Ion Injection Simulation Method>
[Ion Injection Simulation Method using Monte Carle Method]

In an ion injection simulation method using the Monte Carle method, tracking calculation of ion species is performed until the ion species injected into an injection sample such as a substrate, structure or the like are dispersed with atoms in the injection sample and decelerate or stop.

The deceleration of the injected ions depends on two-body elastic collision of the injection sample (substrate, structure, or the like) with atoms, and energy loss based on electrons in the sample. The stop positions of the injected ions are determined by undergoing these processes. In the Monte Carle method, setting of initial values of the injected ions or selection of a dispersion process is randomly set and the stop positions of the ion species calculated by repeating the calculation several times are expressed as impurity distribution.

Figure 1A:
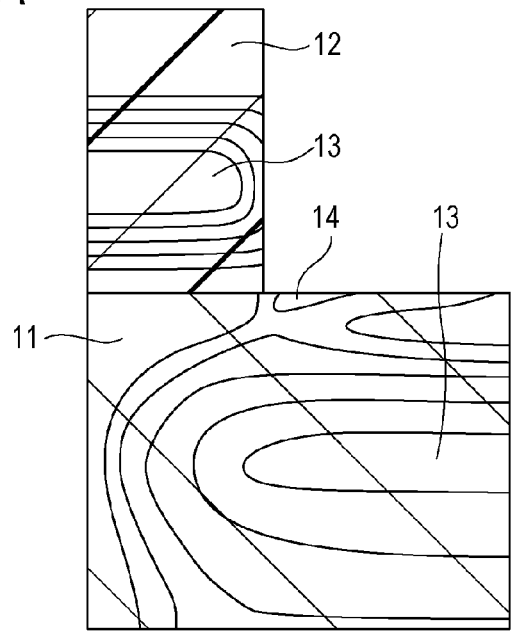
FIG. 1A and FIG. 1B are diagrams illustrating a result of ion injection simulation according to a Monte Carle method.
Figure 1B:
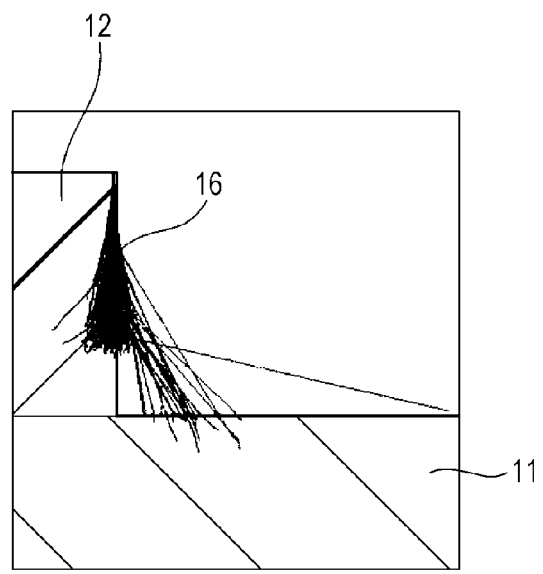

FIG. 1A and FIG. 2B show an ion injection simulation result according to the Monte Carle method. FIG. 1A shows a result of performing ion injection simulation according to the Monte Carle method on a structure for restricting the ion injection on the substrate 11, for example, a sample in which a resist 12 is formed. In FIG. 1A, concentration distribution of impurities in the substrate 11 and the resist 12 are represented using isopleths. FIG. 1B shows a result of performing ion injection simulation according to the Monte Carle method on ion species injected into the vicinity of the side face of the resist 12. As shown in FIG. 1A, uniform concentration distribution 13 is formed around the center of the substrate 11. However, non-uniform impurity distribution 14 is formed around the area of the substrate 11 on which the resist 12 is formed, as compared with the center of the substrate 11. In FIG. 1B, the ion species 16 injected into the vicinity of the side face of the resist 12 are dispersed inside the resist 12, and after moving from the side face of the resist 12 to an area outside that of the resist 12, are injected into the substrate 11.

In the ion injection simulation using the Monte Carle method, it is possible to perform simulation of a well proximity effect as shown in FIG. 1B, to calculate a dispersion process of the ion species 16 in the resist. However, it is necessary to repeat the calculation of the stop positions of the ion species 16, and thus a very long time is necessary as compared with the case of the analytical model.

[Ion Injection Simulation using Analytical Model]

In the ion injection simulation method based on the analytical model, parameters in which distribution of impurities is associated with injection energy, dose amount and the like are substituted for the distribution function, to calculate impurity distribution of the substrate.

In a process of producing a semiconductor, in an analytical model for simulating ion injection to the substrate, ion species to be injected in advance and a parameter table for each material of the injection substrate are prepared. In the parameter table, parameters such as the energy, dose amount, tilt angle, twist angle, and through-film thickness regulated for each material are prepared.

In the range defined in the parameter table, a parameter set corresponding to the conditions such as the ion species, the substrate, the energy, the dose amount, the tilt angle, the twist angle, and the through-film thickness is extracted and transmitted to a simulator.

The simulator substitutes the received parameter set for the distribution function to calculate concentration distribution of impurities at an appropriate position in the corresponding material. The analytical model is a technique that is effective in two and three dimensional simulations using the distribution function in the transverse direction, as well as in simulations using a 1-dimensional (depth direction) distribution function.

The distribution function used in the analytical model is, for example, a Gauss distribution function, a half-Gaussian function, a Pearson IV function, or a dual-Pearson IV function.

Figure 2:
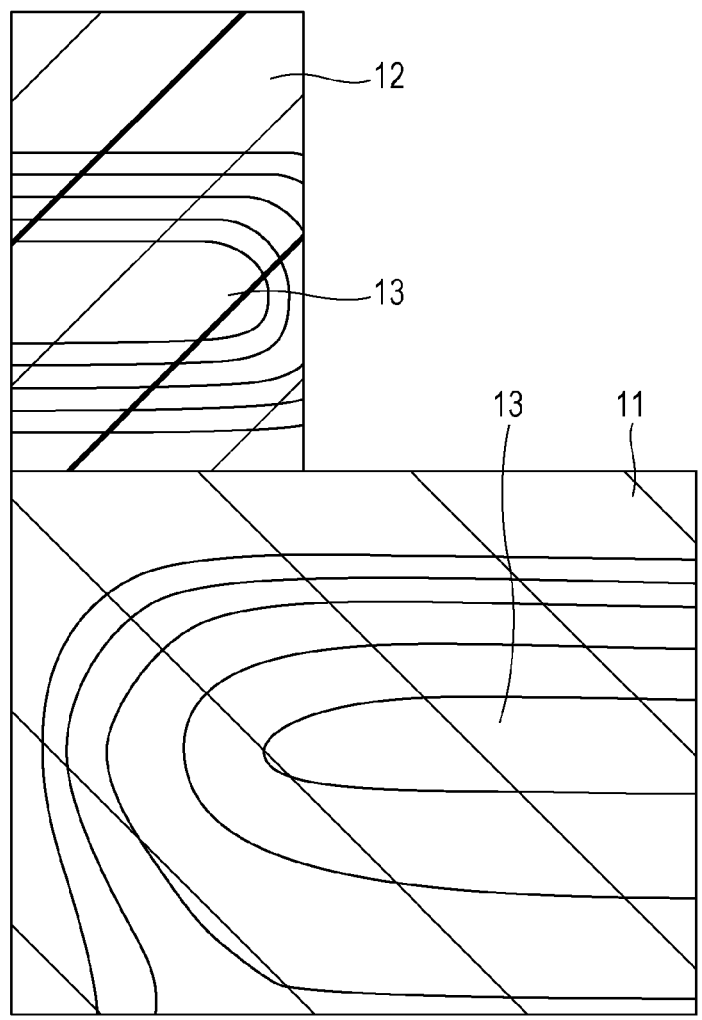
FIG. 2 is a diagram illustrating a result of ion injection simulation based on an analytical model.

In FIG. 2 impurity distribution based on the ion injection simulation using the analytical model is shown. FIG. 2 shows a result of performing the ion injection simulation using the analytical model, on a structure for restricting the ion injection on the substrate 11, for example, a sample in which a resist 12 is formed.

In FIG. 2, concentration distribution of impurities in the substrate 11 and the resist 12 are represented using isopleths.

In the simulation based on the analytical model, among the impurities injected into the structure formed on the substrate 11 such as the resist 12, impurities disposed outside the area of the resist 12 by a transverse distribution coefficient $L\sigma$ or the like are neglected. For this reason, the well proximity effect in which ions are dispersed in the material of the structure formed on the substrate 11 such as the resist 12, are emitted to a space, and are reinjected into the substrate 11, does not reappear. Accordingly, in the analytical model described above, the dispersion effect in the structure does not reappear, and the simulation of the well proximity effect is not performed.

[Distribution Function: Pearson Function]

As an example of the distribution function used in the analytical model of the ion injection simulation, the Pearson function will be described.

The Pearson function that is a probability distribution function is defined using amounts relating to moment of distribution. First, distribution in the depth direction is as follows.

$$f(\bar{z}) \qquad (1)$$

As the amounts relating to moment of distribution, a projected range $R_P$, a dispersion $\sigma$, a skewness $\gamma$, and a kurtosis $\beta$ are defined as follows, and an impurity concentration profile at a position of a depth z from the surface of the substrate is expressed.

$$R_p = \int \bar{z} f(\bar{z}) d\bar{z} \quad (2)$$

$$\sigma = \sqrt{\int (\bar{z} - R_p)^2 f(\bar{z}) d\bar{z}}$$

$$\gamma = \frac{\int (\bar{z} - R_p)^3 f(\bar{z}) d\bar{z}}{\sigma^3}$$

$$\beta = \frac{\int (\bar{z} - R_p)^4 f(\bar{z}) d\bar{z}}{\sigma^4}$$

In the formula, the projected range $R_P$ is a parameter representing a peak position of the impurity concentration profile. The dispersion $\sigma$ is a parameter representing enlargement of the impurity concentration profile in the vicinity of the projected range $R_P$. The skewness $\gamma$ is a parameter representing distortion (left-right symmetry) in the depth direction of the impurity concentration profile. The kurtosis $\beta$ is a parameter representing sharpening (pulling) of the impurity concentration profile.

Using the quantities described above the Pearson function is defined by the following differential equation.

$$\frac{d}{dx} f(y) = \frac{y-a}{b_2 y^2 + b_1 y + b_0} f(y) \begin{cases} y = z - R_p \\ b_0 = -\sigma^2 \frac{4\beta - 3\gamma^3}{A} \\ b_1 = -\sigma\gamma \frac{\beta+3}{A} \\ b_2 = -\frac{2\beta - 3\gamma^2 - 6}{A} \\ a = b_1 \\ A \equiv 10\beta - 12\gamma^2 - 18 \end{cases} \quad (3)$$

Herein, theoretically, there is no means for acquiring $R_P$, $\sigma$, $\gamma$, and $\beta$. For this reason, it is necessary to extract these parameters using measurement data such as a secondary ion mass spectrometry.

In the ion injection calculation using the dual-Pearson IV function, a distribution function is created using two Pearson functions, and may be represented as follows.

$$f(z) = r \cdot P_1(\bar{z}) + (1-r) \cdot P_2(\bar{z}) \quad (4)$$

Herein, $P_1$ and $P_2$ are the standardized Pearson functions. Accordingly, f(z) is standardized. In the formula, r is $0 \le r \le 1$, and represents a weight when the Pearson function $P_1$ is additionally set.

The first Pearson function $P_1$ corresponds to distribution representing random dispersion between the injection ions and the substrate. The second Pearson function $P_2$ represents a channeling component representing a crystalline property of the substrate.

To summarize these, the dual-Pearson function may be represented by a total of nine parameters: $P_1$ ($R_{P1}$, $\sigma_1$, $\gamma_1$, and $\beta_1$), $P_2$ ($RP_2$, $\sigma_2$, $\gamma_2$, and $\beta_2$), and r representing both weights.

As for the ion injection simulation using the dual-Pearson IV function, parameter extraction or a simulation method is disclosed in Changhae Parka, Kevin M. Kleina and Al F. Tascha, "Efficient modeling parameter extraction for dual Pearson approach to simulation of implanted impurity profiles in silicon", Solid-State Electronics, Volume 33, Issue 6, June 1990, Pages 645-650 described above and the like. For example, a method of accurately extracting the nine parameters for modeling the impurity distribution using the dual-Pearson IV function by a 2-stage extraction process is disclosed. It is disclosed that measurement data is accumulated in a database (parameter table) to extract the parameters for the modeling.

The Pearson function parameters $P_1$ ($R_{P1}$, $\sigma_1$, $\gamma_1$, and $\beta_1$) and $P_2$ ($R_{P2}$, $\sigma_2$, $\gamma_2$, and $\beta_2$) may be associated with injection energies for each injection material, and are accumulated as a data table in a database or the like. In the ion injection simulation method, the parameters corresponding to the injection material and the injection energy are read from the parameter table. The read parameters are substituted for the formula, and the impurity concentration distribution is calculated.

<2. First Embodiment of Ion Injection Simulation Method>

[Ion Injection Simulation Method using Analytical Model: Injection Re-Dispersion Model]

Hereinafter, an embodiment of an ion injection simulation method will be described.

Figure 3A:
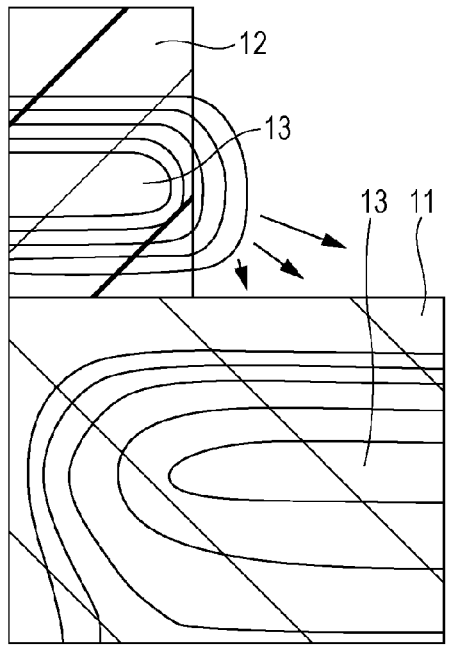
FIG. 3A is a diagram illustrating a result of ion injection simulation based on an analytical model.

In the embodiment, the ion injection simulation of the well proximity effect is performed using the analytical model described above. As shown in FIG. 3A, the ion injection simulation method of the embodiment will be described on the basis of a case where the ion injection is performed on the substrate 11 formed of a semiconductor or the like as and the resist 12 as a structure for restricting the ion injection, as ion injection samples.

In the analytical model of the related art described above, among the impurities injected into the resist 12, the impurities disposed outside the area of the resist 12 by a transverse distribution coefficient $L\sigma$ or the like are neglected. However, the concentration distribution 13 of the impurities injected into the resist 12 is expressed as shown in FIG. 3A. When isopleths are drawn on the concentration distribution 13, the high concentration distribution 13 based on transverse diffusion of impurities in the resist 12 is continuously formed to the side face of the resist 12. The amount of impurities disposed from the side face of the resist 12 to the outside of the resist 12 are modeled as the amount of impurities reinjected into the substrate 11 (injection re-dispersion model).

That is, in the distribution of impurities injected and disposed in the structure for restricting the ion injection such as resist and polysilicon, gases on the side face or impurities disposed in vacuum are summed, and the amount of impurities is considered as a dose amount reinjected into the substrate by the well proximity effect. The reinjected dose amount is modeled as the amount of impurities of the well proximity effect.

Herein, data necessary to perform the modeling of the injection re-dispersion model are the amount of impurities disposed from the resist to the outside, the injection angle distribution when the impurities are reinjected into the substrate, the injection energy distribution when the impurities are reinjected into the substrate, and the reinjection start point of the impurities.

The amount of impurities disposed outside the resist area from the reinjection start point, which has been neglected as the distribution of the analytical model of the related art described above is set to a reinjection dose amount D.

Figure 3B:
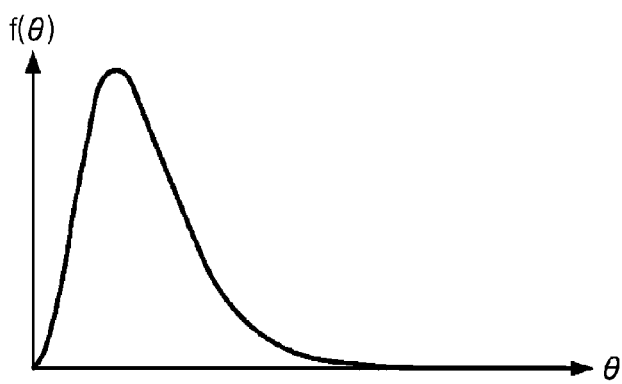
FIG. 3B is a diagram illustrating injection angle distribution of the analytical model.

The injection angle distribution of the impurities reinjected from the reinjection start point on the resist side face to the substrate is set to a distribution function $f(\theta)$. As shown in FIG. 3B, the injection angle distribution function $f(\theta)$ is considered as gamma or log-normal distribution.

Figure 3C:
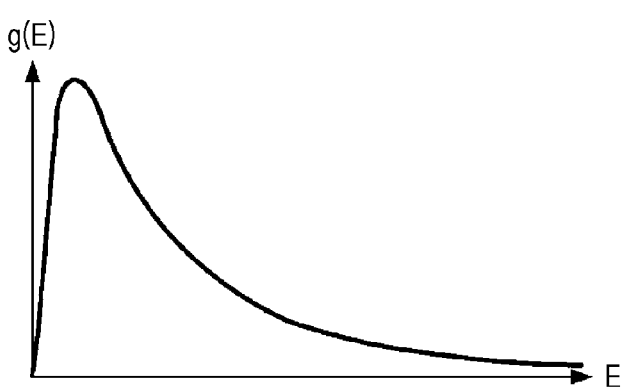
FIG. 3C is a diagram illustrating energy distribution of the analytical model.

The energy distribution of the impurities reinjected from the reinjection start point on the resist side face to the substrate is set to a distribution g(E). As shown in FIG. 3C, the energy distribution function g(E) is considered as a gamma or a log-normal distribution.

The injection from an appropriate area (reinjection start point) on the resist side face to the area of the substrate which is not covered with the resist is calculated using the dose amount D and two distribution functions of f(θ) and g(E), thereby performing calculation of the impurity distribution causing the well proximity effect.

[Simulation Flow]

Figure 4:
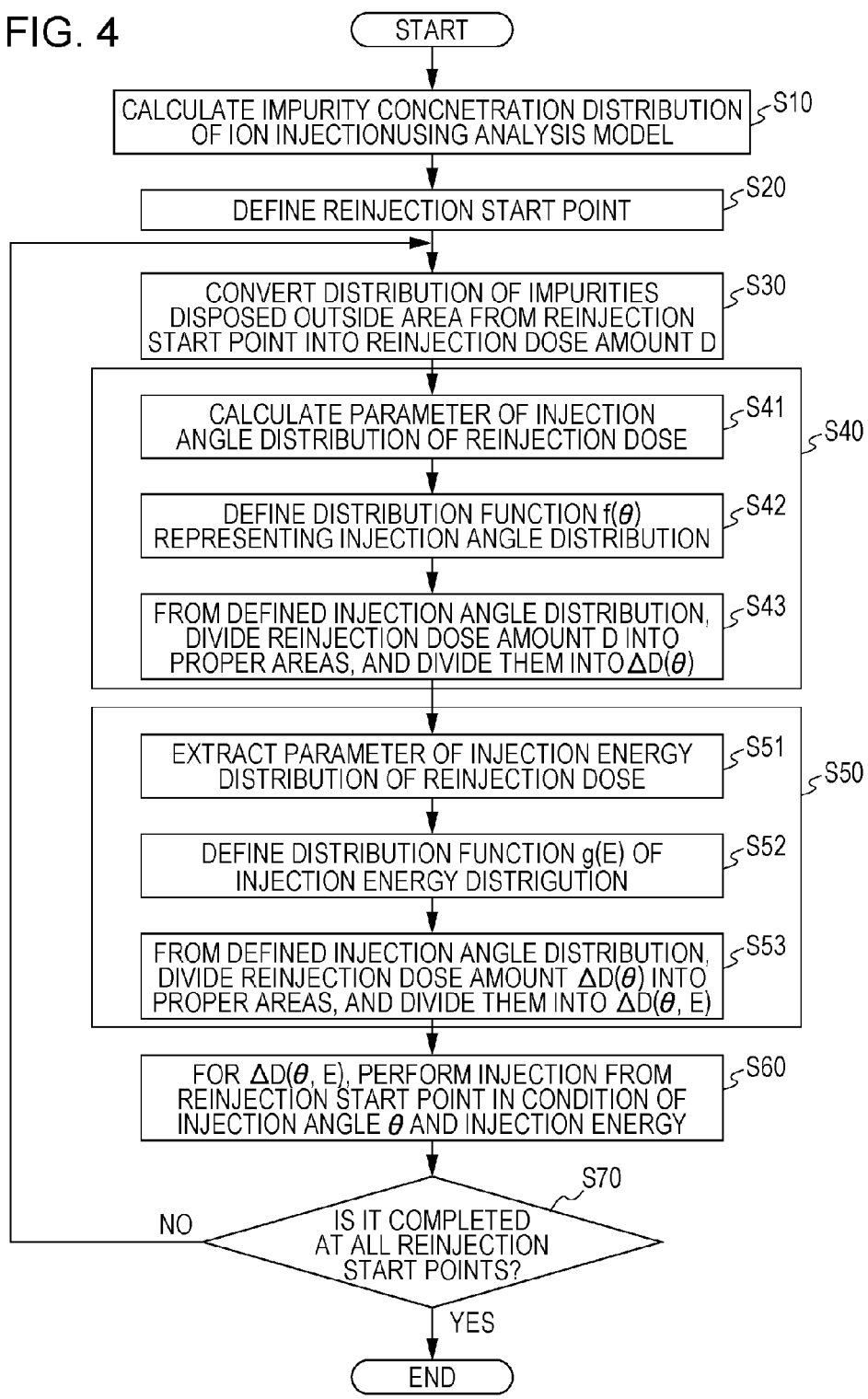
FIG. 4 is a flowchart of ion injection simulation.

In FIG. 4 a flowchart illustrating the injection re-dispersion model ion injection simulation of calculating the concentration distribution of the impurities considering the impurities reinjected from the resist to the substrate using the analytical model described above is shown.

In S10, the impurity concentration distribution is calculated using the analytical model. For example, using the Pearson function, the concentration distribution of the impurities ion-injected into the substrate 11 and the resist 12 is calculated. In the calculation of the impurity distribution, the simulation of the impurity distribution is performed on each of the substrate 11 and the resist 12 using the analytical model of the related art. An example of the impurity distribution of the substrate 11 and the resist 12 is shown in FIG. 2 described above, and the concentration distribution of the impurities is represented using isopleths.

In S20, the reinjection start point of the reinjection dose is defined.

Among the impurities injected into the resist 12, in the impurities disposed outside the resist 12 by the transverse distribution coefficient Lσ, it is necessary to define the reinjection start point at a position where the impurities are ejected at a predetermined energy and angle from the resist 12. The position is called the reinjection start point.

The reinjection start point is defined at the position where the concentration distribution is formed outside the area of the structure, from the calculated impurity concentration distribution. In the structure of the ion injection area of performing the simulation, the reinjection start point is defined at a position where the well proximity effect may be considered to occur in advance. For example, the reinjection start point is defined on the side face of the resist formed on the substrate or the side face of a trench formed on the substrate.

The following process is performed for each reinjection start point defined herein. In all the reinjection start points, the concentrations of the reinjected ions are summed to determine the well proximity effect.

The definition of the reinjection start point includes the substrate surface and positional height, and it is preferable to perform the calculation of the reinjection dose in order from high reinjection start points.

The reinjection start point may be defined as follows.

Figure 5A:
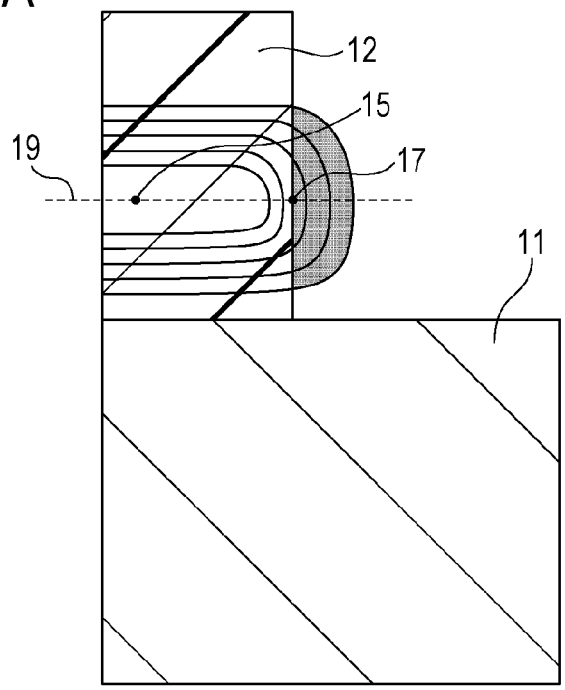
FIG. 5A and FIG. 5B are diagrams illustrating a reinjection start point.

As shown in FIG. 5A, a position 15 where the concentration of impurities disposed in the resist 12 is the maximum is calculated. On the side face of the resist 12, a position of the same y coordinate 19 as the position 15 where the concentration of impurities disposed in the resist 12 is defined as the reinjection start point 17 of the reinjection dose. All the reinjection doses are injected from this reinjection start point. In this case, all the impurities disposed outside the area on the side face of the resist 12 are converted into the reinjection dose amount D from the reinjection start point.

The reinjection start point may be defined as follows.

Figure 5B:
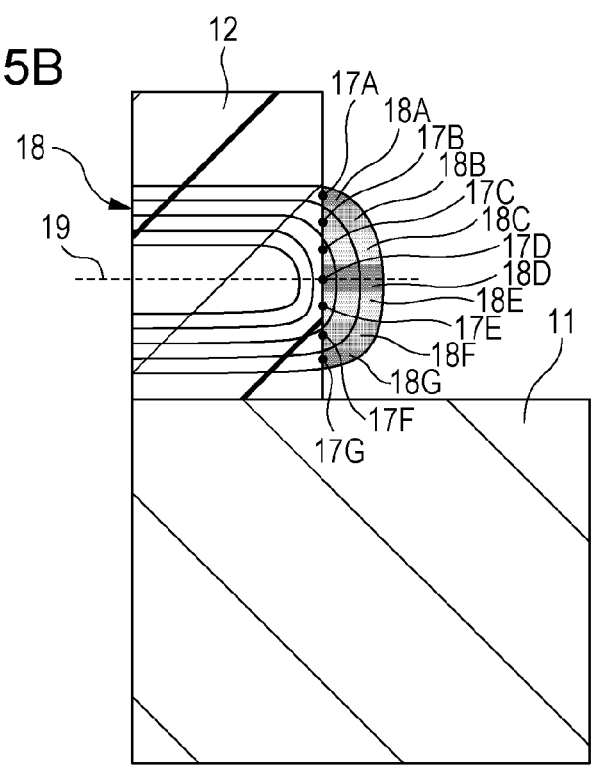

As shown in FIG. 5B, in the area 18 where impurities with a concentration equal to or higher than a predetermined value on the outside of the resist 12, the area 18 is divided for each concentration in the direction of y axis 19. In each of the areas 18A to 18G, the center position of the side face of the resist 12 is the reinjection point 17. In the example shown in FIG. 5B, the area 18 is divided into seven parts, the reinjection start points 17A, 17B, 17C, 17D, 17E, 17F, and 17G are defined for the areas 18A, 18B, 18C, 18D, 18E, 18F, and 18G, respectively. That is, in this case, the reinjection start point 17 is defined for each area divided according to the concentration, and thus a plurality of reinjection start points are defined.

When the plurality of reinjection start points are defined, the reinjection doses from the reinjection start points are divided for each concentration, and become the amount of the sum of all the reinjection doses in the areas 18A to 18G. That is, in the areas 18A to 18G divided into the plurality of parts in a strip form along the y axis 19 shown in FIG. 5B, all the impurities disposed outside the area on the side face of the resist 12 are converted into the reinjection dose amount D.

In S30, among the impurities distributed in the resist 12 by the ion injection, the amount of impurities disposed outside the area on the side face of the resist 12 is converted into the reinjection dose amount D.

Among the impurities injected into the resist 12 in the analytical model, the impurities disposed outside the area of the resist 12 by the transverse distribution coefficient Lσ are the reinjection dose reinjected into the substrate 11. The reinjection dose is calculated from the transverse diffusion amount of impurities in the resist 12 using the analytical model described above, and the sum amount of reinjection doses is converted into the reinjection dose amount D.

In S40, an angle distribution function of the reinjection dose is defined. In Step S50, an energy distribution function of the reinjection dose is defined. In the angle distribution function and the energy distribution function, injection angle distribution of doses of impurities injected from the side face of the resist 12 to the substrate 11 is defined as a distribution function f(θ), and similarly, energy distribution is defined as a distribution function g(E). The reinjection angle of the reinjection dose and the reinjection energy are set using the distribution functions f(θ) and g(E).

As the distribution functions used in the reinjection angle distribution function f(θ) and the reinjection energy distribution function g(E), a log-normal distribution function, gamma distribution, and Poisson distribution are used. A database corresponding to an injection conditions is prepared in advance, and parameters corresponding thereto are extracted from the database at the time of calculation and are applied.

A method of defining the angle distribution function of the reinjection dose in S40 will be described.

In S41, the parameters corresponding to the angle distribution function of the reinjection dose, the ion injection conditions, and the material of the resist 12 are extracted from the table of the database. The ion injection conditions are, for example, ion species, energy, a dose amount, a tilt angle, and a twist angle.

In S42, the extracted parameters are substituted for the angle distribution function of the reinjection dose, thereby defining the distribution function f(θ) representing the injection angle distribution. For example, as the angle distribution function, the log-normal distribution function described above is used. Parameters of the log-normal distribution function are extracted from the table of parameters accumulated in advance according to the reinjection conditions such as the injection ion species and the material of the substrate 11.

In S43, the reinjection dose amount D is classified into a proper area by the injection angle distribution defined as the distribution function f(θ) described above. The reinjection dose amount D is classified into the distribution function f(θ), and the reinjection dose amount D is thereby divided into a reinjection does amount ΔD(θ) for each injection angle.

A method of defining the energy distribution function in S50 will be described.

In S51, the parameters formed of the energy distribution function of the reinjection dose, the ion injection conditions, and the material of the resist are extracted from the table of the database. The ion injection conditions are, for example, ion species, energy, a dose amount, a tilt angle, and a twist angle.

In S52, the extracted parameters are substituted for the energy distribution function of the reinjection dose, thereby defining the distribution function g(E) representing the injection energy distribution. For example, as the energy distribution function, the log-normal distribution function described above is used. The parameters of the log-normal distribution function are extracted from the table of parameters accumulated in advance according to the reinjection conditions such as the injection ion species and the material of the substrate.

In S53, the reinjection dose amount $\Delta D(\theta)$ of each injection angle is divided into a proper area using the injection energy distribution defined as described above. The reinjection dose amount $\Delta D(\theta)$ is divided into the energy distribution function g(E), and the reinjection dose amount D is thereby divided into the reinjection dose amount $\Delta D(\theta)$ of each injection angle and each reinjection energy.

Figure 6A:
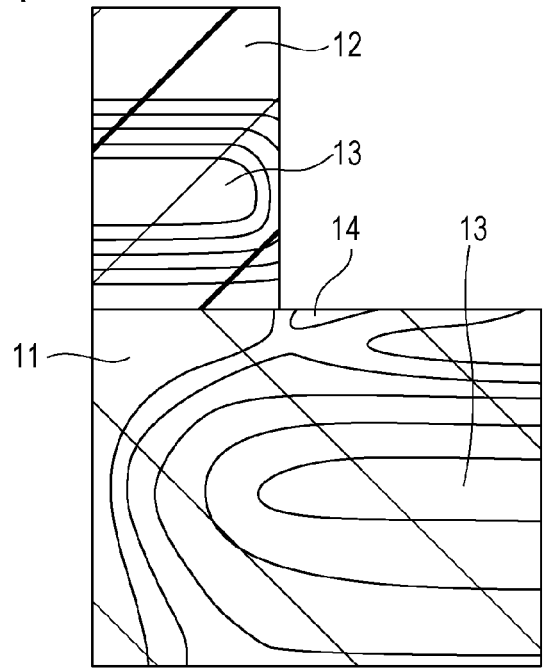
FIG. 6A and FIG. 6B are diagrams illustrating a result of ion injection simulation based on an analytical model.
Figure 6B:
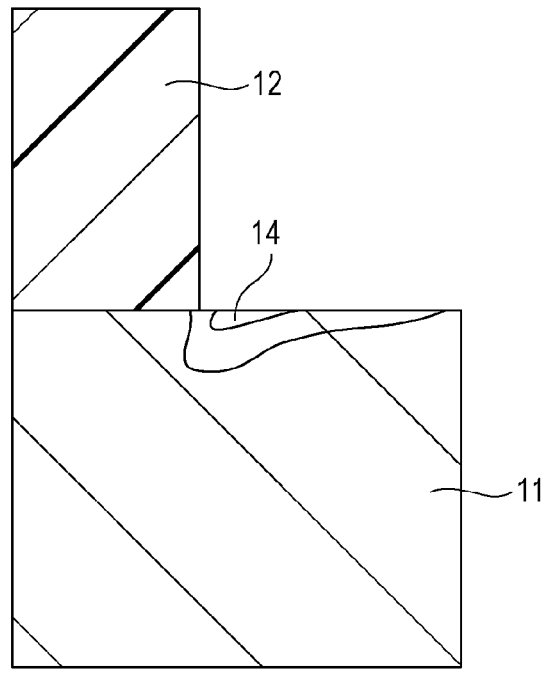

In S60, calculation of the impurity distribution based on the injection of the reinjection dose from the reinjection start point to the substrate is performed in the injection conditions of the injection angle $\theta$ and the injection energy E for $\Delta D(\theta, E)$. The parameter of the analytical model of the calculation may be extracted from the parameter table used in the analytical model of the related art. As shown in FIG. 6A, the calculation of the impurity distribution may be represented by adding the impurity distribution 14 based on the reinjection dose to the concentration distribution 13 of the impurities in the substrate 11 and the resist 12 calculated by the analytical model of the related art in S10. As shown in FIG. 6B, the impurity distribution 14 based on the reinjection dose in the substrate 11 only may be shown.

In S70, calculation of the impurity distribution based on the injection of the reinjection dose of S60 is performed on all the reinjection start points defined in S20. For example, as shown in FIG. 5B, a plurality of reinjection start points 17A to 17G on the side face of the resist are defined. Since the process described above is performed for each reinjection start point, it is determined whether or not the calculation of the impurity distribution based on the reinjection dose is completed at all the reinjection start points. When there is a reinjection start point for which the calculation process has not been performed, returning to S30, the calculation for the non-processed reinjection start point is performed.

At all the reinjection start points, the calculation of the impurity distribution based on the reinjection dose is performed, and then the injection re-dispersion mode ion injection simulation is completed.

By the process described above, it is possible to determine the impurity concentration distribution and the well proximity effect using the analytical model by the injection re-dispersion model ion injection simulation.

The ion injection is performed on the simulation result described above, and thus it is possible to produce a semiconductor device having the desired characteristics.

First, design of the semiconductor device is performed using the ion injection simulation described above. Using the simulation described above, it is possible to predict in advance the well proximity effect at predetermined ion injection conditions. For this reason, in the design of the semiconductor device, it is possible to optimize the ion injection conditions.

For example, in the production of the semiconductor device, a structure such as a resist for restricting the ion injection area is formed. In the structure, the ion injection is performed according to the conditions determined by the ion injection simulation described above, and thus it is possible to produce the semiconductor device.

In the production of a semiconductor device, using the simulation described above, since the ion injection conditions are optimized by the design of the semiconductor device, it is possible to produce the semiconductor device on the basis of a design in which the well proximity effect is considered in advance.

In the injection re-dispersion model ion injection simulation, the distribution function is a mere mathematical function, and a value is defined to an area which it is not necessary to physically consider. For this reason, the distribution function is cut-off. For example, in the angle distribution of the reinjection, when the injection angle $\theta$ is equal to or more than 90°, ions are not injected into the substrate, it is not necessary to consider it. In the injection angle $\theta$, a line connecting the reinjection start point to the intersection point with the substrate of the vertical line of the reinjection start point is $\theta=0$, and the injection angle $\theta$ is defined in the direction so as not to be covered with the resist.

Similarly, in the reinjection energy distribution, the reinjection energy is not larger than the initial injection energy. This is because kinetic energy of the ions is reduced by the dispersion in the period up until to the reinjection time. For this reason, it is not necessary to consider the reinjection energy distribution in a range larger than the initial energy.

In addition, the cut-off from the impurity concentration distribution may be performed on the reinjection start point defined in S20. When the amount of impurities disposed outside the area of the defined reinjection start point is as small as the influence on the well proximity effect is negligible, the processes after S30 are not performed on the reinjection dose from the reinjection start point, and the simulation may be performed.

As described above, on the basis of the initial injection conditions, a database in which cut-off of the appropriate parameter range can be made is prepared in advance, and thus it is possible to obtain the proper cut-off value with reference to the database for cut-off during the calculation.

An integral value of the distribution function is standardized to 1 in the range to infinity, but for reasons like those described above it is necessary to appropriately perform standardization when the cut-off of the parameter range is performed.

In the embodiment described above, the log-normal distribution function is used as the distribution function, but for example, a function system such as a Gaussian function or a half-Gaussian function may be used.

Similar to the analytical model simulation of the related art, it is possible to support a multilayer film model.

In the simulation method described above, the angle distribution function of the reinjection dose is defined in S30 and then the energy distribution function of the reinjection dose is defined in S40, but such sequence is not considered. For example, the energy distribution function of the reinjection dose may be defined, and then the angle distribution function of the reinjection dose may be defined.

[Modified Example: Side Face of Structure is Inclined]

In the first embodiment described above, a case where the side face of the structure formed of the resist is perpendicular to the substrate is illustrated as an example. However, generally, the side face of the resist or the like formed on the substrate is not a face perpendicular to the substrate face, but is formed by an inclined face, a curved face, or a face formed by a combination thereof.

As described above, even when the side face of the structure is configured by an inclined face or a curved face, it is possible to perform the injection re-dispersion model ion injection simulation described above.

Figure 8A:
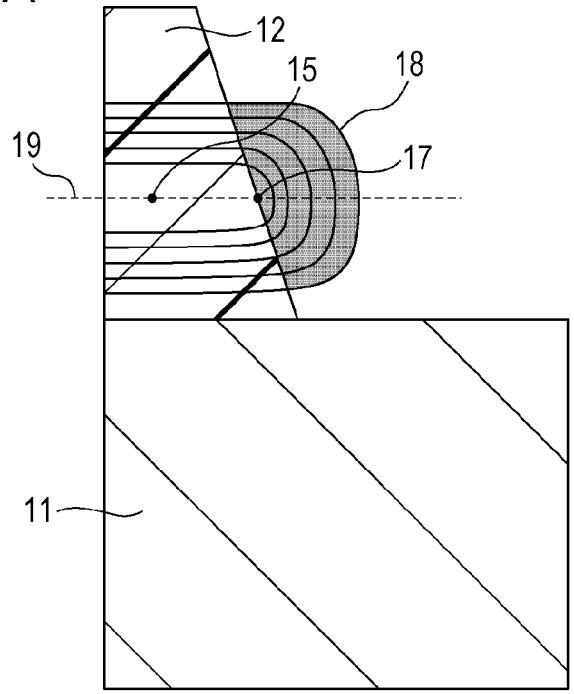
FIG. 8A is a diagram illustrating impurity concentration distribution based on ion injection simulation.
Figure 8B:
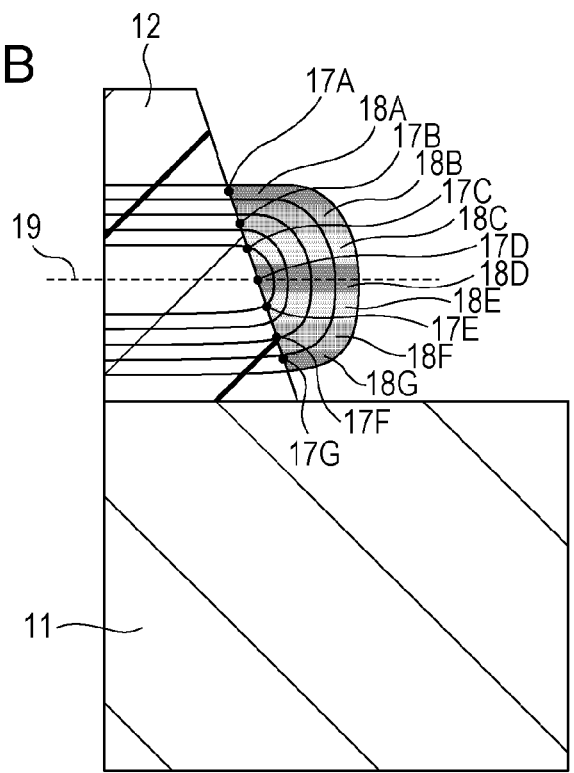
FIG. 8B is a diagram illustrating a reinjection start point based on ion injection simulation.

In FIG. 8A and FIG. 8B, concentration distribution of impurities and reinjection start points when the side face of the resist 12 is formed obliquely with respect to the surface of the substrate are shown. FIG. 8A shows a case where one reinjection point with respect to side face of the resist 12 is defined. FIG. 8B shows a case where a plurality of reinjection points with respect to the side face of the resist 12 is defined.

As shown in FIG. 8A, when one reinjection start point is defined with respect to the side face of the resist 12, a side face position of the resist 12 on the same y coordinate 19 as a position 15 at which the concentration of the impurities disposed in the resist 12 is defined as the reinjection start point 17.

It is possible to determine the impurities disposed outside the area from the resist 12 by calculating the concentration distribution injected into the resist 12 using the distribution function. In FIG. 8A, the concentration distribution of the impurities calculated using the distribution function is represented for both inside the resist 12 and outside the area of the resist 12 using isopleths. All the impurities in the concentration distribution area 18 disposed outside the area of the resist 12 are converted from the injection start point 17 into the reinjection dose amount D.

In FIG. 8A, since the side face of the resist 12 is formed obliquely with respect to the substrate 11, the position and size of the concentration distribution area 18 disposed outside the area of the resist 12 is different from the case shown in FIG. 5A described above. That is, the shape of the concentration distribution area 18 disposed outside the area is changed according to the shape of the face on which the reinjection start point is defined. For this reason, the amount of impurities disposed outside the area is affected by the shape of the face of the structure on which the injection start point is defined.

As described above, even when the amount of impurities is affected by the shape of the side face of the structure, it is possible to perform the conversion of the reinjection dose amount D by calculating the distribution of the impurities disposed outside the area of the structure by the analytical model using the distribution function.

Accordingly, after the reinjection start point is defined, the distribution of the impurities disposed outside the area of the structure is calculated using the analytical model, and it is possible to convert the reinjection dose amount D reinjected from the reinjection start point 17 to the substrate 11 using the calculated impurity distribution.

Similar to the first embodiment described above, the angle distribution function of the reinjection dose is defined, the energy distribution function is defined, and thus it is possible to perform the injection re-dispersion model ion injection simulation.

As shown in FIG. 8B, when a plurality of reinjection start points 17A to 17G are defined, the area 18 where impurities of concentration equal to or higher than a predetermined value are disposed outside the area of the resist 12 is divided for each concentration in a direction of the y coordinate 19 to be 18A to 18G. In the divided areas 18A to 18G, the center position of the side face of the resist 12 is defined as the reinjection start points 17A to 17G.

The reinjection dose amount D at each of the reinjection start points 17A to 17G may be determined as follows.

First, concentration distribution in the area and outside the area of the resist 12 is determined from the impurity concentration distribution calculated using the analytical model. In FIG. 8B, the impurity concentration distribution is represented by isopleths. The impurity concentration distribution is divided into areas 18A to 18G.

The impurities in the concentration distribution divided into the areas 18A to 18G are converted into the reinjection dose amounts D from the reinjection start points 17A to 17G of the areas 18A to 18G. For example, in the area 18A in which the reinjection start point 17A is defined, from the concentration distribution formed inside and outside the resist 12 from the distribution function, all the impurities included in the range of the area 18A disposed outside the area of the resist 12 are converted in to the reinjection dose amount D from the reinjection start point 17A.

Similar to the first embodiment described above, the angle distribution function of the reinjection dose is defined, the energy distribution function is defined, and thus it is possible to perform the injection re-dispersion model ion injection simulation.

As described above, even when the shape of the structure in which the reinjection start point is defined and the number of reinjection start points defined on the face of the structure are arbitrary, it is possible to perform the injection re-dispersion model ion injection simulation described above.

In the modified example described above, the case where the side face of the resist 12 is an inclined face has been described, but the present disclosure may be applied to a case where a curved face or a complex face formed by a combination thereof. As described above, the reinjection start point on the side face is defined, the conversion of the reinjection dose amount D disposed outside the area on the side face is performed, and thus it is possible to apply the present disclosure to any face.

<3. Second Embodiment of Ion Injection Simulation Method>

[Example: Reinjection Model from Plurality of Structures]

In the embodiment described above, as shown in FIG. 1, the embodiment of the ion injection simulation when one structure is formed on the substrate 11 has been described, but it is possible to perform the ion injection simulation described above even when there is a plurality of reinjection structures. Hereinafter, according to the flowchart shown in FIG. 4 described above, the ion injection simulation method of the second embodiment will be described.

Figure 9A:
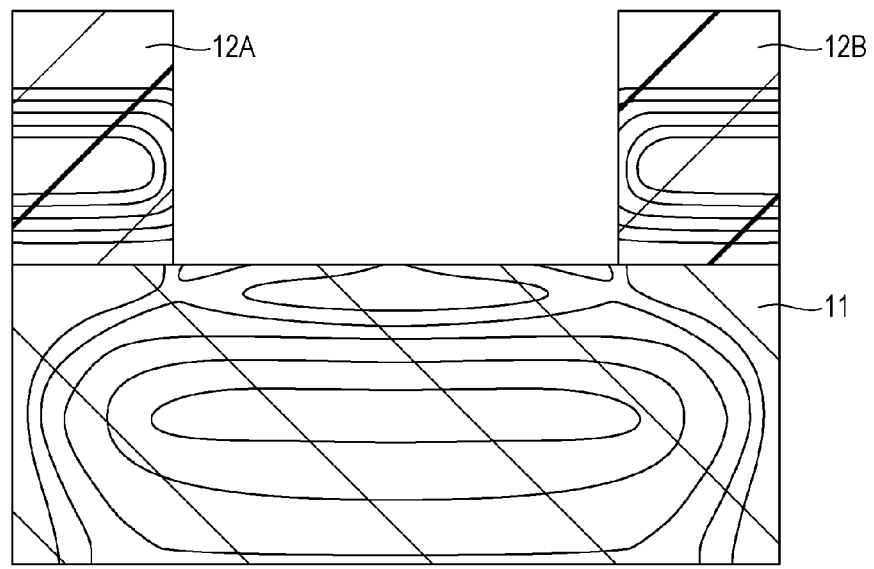
FIG. 9A is a diagram illustrating impurity concentration distribution based on ion injection simulation.
Figure 9B:
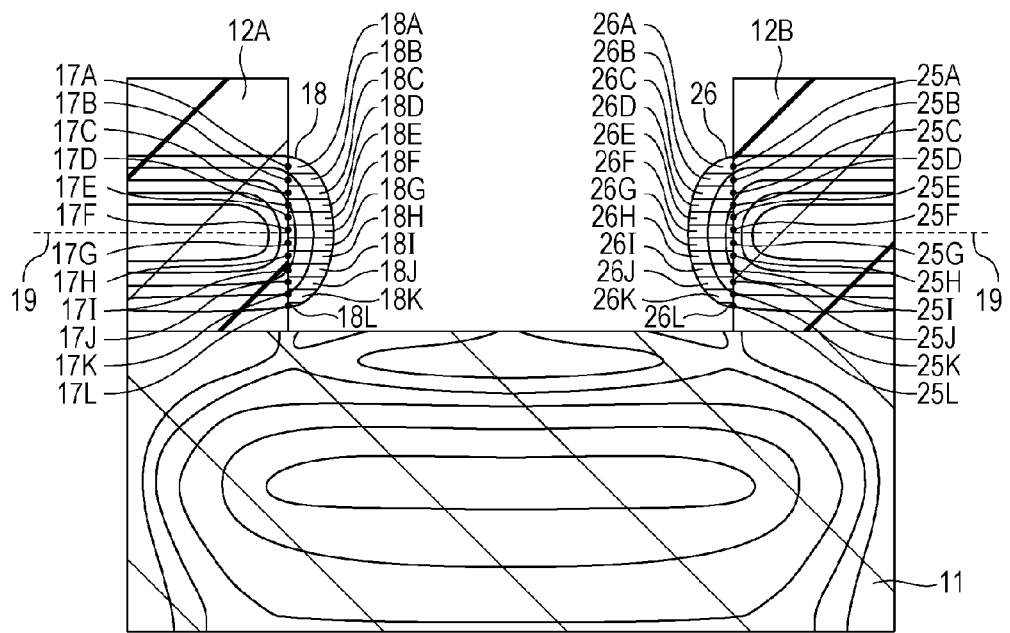
FIG. 9B is a diagram illustrating a reinjection start point based on ion injection simulation.

FIG. 9A and FIG. 9B show a structure of an ion injection area according to the ion injection simulation method of the embodiment. FIG. 9A shows an example of concentration distribution of impurities determined by the injection re-dispersion model ion injection simulation when resists 12A and 12B are formed on the substrate 11. FIG. 9B shows a plurality of reinjection start points defined for the resists 12A and 12B and concentration distribution disposed outside the resists 12A and 12B calculated using the distribution function using isopleths.

As shown in FIG. 9A and FIG. 9B, the resists 12A and 12B are formed as the plurality of structures on the substrate 11. In the structures, the reinjection from the side face of the resist 12A and the side face of the resist 12B to the substrate 11 is possible. For this reason, the reinjection start points are defined on the side face of the resist 12A and the side face of the resist 12B.

First, in S10, the impurity concentration distribution is calculated using the analytical model. In FIG. 9A and FIG. 9B, the concentration distribution of the impurities is represented by isopleths.

Then, in S20, the reinjection start points are defined at the position where the concentration distribution is formed outside the area of the structure from the calculated impurity concentration distribution. In the configuration shown in FIG. 9A and FIG. 9B, the reinjection start points are defined on the side face of the resist 12A and the side face of the resist 12B. Herein, as shown in FIG. 9B, a plurality of reinjection start points 17A to 17L are defined on the side face of the resist 12A using the same method as shown in FIG. 5B described above. In the same manner, for the resist 12B, a plurality of reinjection start points 25A to 25L are defined on the side face.

In the definition of the reinjection start points, first, as shown in FIG. 9B, areas 18 and 26 where impurities of concentration equal to or higher than a predetermined value are disposed outside the areas of the resists 12A and 12B are divided for each concentration in the direction of the y coordinate 19 into areas 18A to 18L and areas 26A to 26L. In the divided areas 18A to 18L and areas 26A to 26L, the center positions of the side faces of the resists 12A and 12B are defined as the reinjection start points 17A to 17L and the reinjection start points 25A to 25L.

In this case, it is preferable to define the positions of the reinjection start points of the side face of the resist 12A and the positions of the reinjection start points of the side face of the resist 12B at the same height positions from the substrate 11.

For example, when the resist 12A and the resist 12B are formed of the same material and at the same thickness, the impurity distribution in the substrate 11 based on the well proximity effect is symmetric at the center of the resists 12A and 12B. When the heights of the reinjection start points of the resist 12A and the resist 12B differ, the angle distribution of the reinjection dose from the reinjection start point deviates between the resist 12A and the resist 12B. For this reason, the concentration distribution which should be symmetric becomes asymmetric.

For this reason, when considering the reinjection dose from the plurality of structures, it is possible to obtain more uniform concentration distribution by defining the reinjection start points in the structures to be at the same height position.

Then, in S30, conversion of the reinjection dose amounts D from the reinjection start points 18A to 18L and 26A to 26L is performed.

First, concentration distribution of impurities in the area and outside the area of the resists 12A and 12B is determined from the impurity concentration distribution calculated using the analytical model. The impurity concentration distribution outside the area of the resists 12A and 12B is divided into the areas 18A to 18L and the areas 26A to 26L.

The impurities in the concentration distribution divided into the areas 18A to 18L and the areas 26A to 26L are converted into the reinjection dose amounts D from the reinjection start points 17A to 17G and 25A to 25L of the areas 18A to 18L and the areas 26A to 26L.

For example, in the area 18A in which the reinjection start point 17A is defined, from the concentration distribution formed inside and outside the resist 12 from the distribution function, all the impurities included in the range of the area 18A disposed outside the area of the resist 12 are converted in to the reinjection dose amount D from the reinjection start point 17A.

Then, in S40, an angle distribution function of the reinjection dose is defined. In Step S50, an energy distribution function of the reinjection dose is defined, and the reinjection dose amount $\Delta D(\theta, E)$ is determined.

In S60, calculation of the impurity distribution based on the injection of the reinjection dose from the reinjection start point to the substrate is performed under conditions with the injection angle $\theta$ and the injection energy E for the reinjection dose amount $\Delta D(\theta, E)$.

In addition, the reinjection dose reinjected from the reinjection start point of one resist to the other resist is considered. Accordingly, calculation of the impurity distribution based on the injection of the reinjection dose from the reinjection start point to the other resist is performed under conditions with the injection angle $\theta$ and the injection energy E for the reinjection dose amount $\Delta D(\theta, E)$.

The reinjection does not occur at a position higher than the reinjection start point. For this reason, even when the reinjection is performed from one resist to the other resist, reinjection at a position higher than the reinjection start point is not performed. For this reason, the calculation of the reinjection dose from a reinjection start point at a high position is performed and the calculation of the reinjection dose from the reinjection start point at a position lower than this is performed by adding the reinjection dose from the reinjection start point at the high position. By this method, it is possible to calculate the concentration distribution including the reinjection dose further reinjected into the substrate after the reinjection is performed from one resist to the other resist, as well as the reinjection dose from the resist to the substrate.

For this reason, the calculation of the impurity distribution based on the reinjection dose amount $\Delta D(\theta, E)$ from the reinjection start point described above begins from the reinjection start point at the highest position. In the calculations from the reinjection start point thereafter, the reinjection dose amount $\Delta D(\theta, E)$ is calculated to include the reinjection dose amount from the position higher than the reinjection start point for the calculation.

The calculation is repeated at all the reinjection start points for each reinjection start point from the high position to the low position. The calculation from all the reinjection start points is completed, and thus it is possible to perform the injection re-dispersion model ion injection simulation.

In addition, it is possible to perform design of the semiconductor device on the basis of the ion injection simulation described above. It is possible to produce the semiconductor device according to the design. The influence of the well proximity effect is predicted in advance by the simulation described above, and it is possible to optimize the ion injection in the design and production processes of the semiconductor device.

In the above description, the case where a plurality of reinjection start points for the structure has been described, but for example, the present disclosure may be applied to a case where one reinjection start point for the structure is defined, as shown in FIG. 5A described above.

<4. Third Embodiment of Ion Injection Simulation Method>

[Example: Defining Reinjection Start Point on Substrate]

Next, an ion injection simulation method of a third embodiment will be described.

In the embodiment described above, the reinjection from the structure formed on the substrate has been described, but as shown in FIG. 10A to FIG. 10C, even when a trench is formed on the substrate 11, it is possible to apply the injection re-dispersion model from the side face of the trench. Hereinafter, according to the flowchart shown in FIG. 4 described above, the ion injection simulation method of a fourth embodiment will be described.

FIG. 10A to FIG. 10C show a structure of an ion injection area according to the ion injection simulation method of the embodiment. As shown in FIG. 10A, a trench 27 is formed on the substrate 11. A resist 12 is formed on the substrate 11. In FIG. 10B, an example of the impurity concentration distribution determined by the injection re-dispersion model ion injection simulation described above is represented using isopleths. In FIG. 10C an example of a plurality of reinjection start points defined for the structure is shown.

In the structure shown in FIG. 10A to FIG. 10C, reinjection from the resist 12 to the substrate 11 and reinjection from the side face of the trench 27 of the substrate 11 to the other part of the substrate 11 are possible. For this reason, the reinjection start points are defined for the side face of the resist 12 and the side face of the trench 27.

First, in S10, the impurity concentration distribution is calculated using the analytical model.

In S20, the reinjection start points are defined at the position where the concentration distribution is formed outside the area of the structure from the calculated impurity concentration distribution. In the configuration shown in FIG. 10A to FIG. 10C, the reinjection start points are defined on the side face of the resist 12 and the side faces 27A and 27B of the trench 27. Herein, as shown in FIG. 10C, a plurality of reinjection start points 17A to 17J are defined on the side face of the resist 12 using the same method as shown in FIG. 5B described above. In the same manner, for the trench 27, a plurality of reinjection start points 28A to 28G are defined on the side face 27A, and a plurality of reinjection start points 29A to 29G are defined on the side face 27B.

In this case, it is preferable to define the reinjection start points 28A to 28G and the reinjection start points 29A to 29G in the trench 27 at the same height position.

Then, in S30, conversion of reinjection dose amounts D from the reinjection start points 17A to 17J, the reinjection start points 28A to 28G, and the reinjection start points 29A to 29G is performed.

The conversion of the reinjection dose amount D is determined from the impurity concentration distribution calculated using the analytical model in the same manner as the first embodiment and the second embodiment. In the impurity concentration distribution, impurities disposed outside the resist 12 or outside the substrate 11 in the trench 27 are converted into the reinjection dose amount D for each area where the reinjection start points are defined.

Then, in S40, an angle distribution function of the reinjection dose is defined. In Step S50, an energy distribution function of the reinjection dose is defined, and the reinjection dose amount $\Delta D(\theta, E)$ is determined.

In S60, calculation of the impurity distribution based on the injection of the reinjection dose from the reinjection start point to the substrate is performed under conditions with the injection angle $\theta$ and the injection energy E for the reinjection dose amount $\Delta D(\theta, E)$.

The calculation of the impurity distribution based on the reinjection dose amount $\Delta D(\theta, E)$ is performed in order from the reinjection start points defined at the same position in the same manner as the second embodiment. The calculation of all the reinjection start points is repeated, and by completing the calculation from all the reinjection start points it is possible to perform the injection re-dispersion model ion injection simulation.

In the configuration shown in FIG. 10A to FIG. 10C, in the trench 27, the reinjection dose from one side face 27A is reinjected into the bottom of the trench 27 and the other side face 27B. For this reason, in the trench 27, the calculation of the reinjection dose from a reinjection start point at a high position is performed, the reinjection dose from the reinjection start point at a high position is added, and the calculation of the reinjection dose from the reinjection start point at a position lower than this is performed.

By this method, it is possible to calculate the impurity concentration distribution including the reinjection dispersion model in the trench in addition to the reinjection dose from the resist to the substrate.

According to the ion injection simulation method, it is possible to apply the present disclosure to the reinjected impurities depending on the structure such as the trench formed on the substrate in the same manner as the third embodiment described above, as well as the reinjection from the structure on the substrate.

In addition, it is possible to perform design of the semiconductor device on the basis of the ion injection simulation described above. It is possible to produce the semiconductor device according to the design. The influence of the well proximity effect is predicted in advance by the simulation described above, and it is possible to optimize the ion injection in the design and production processes of the semiconductor device.

In this embodiment, a case where one trench is formed on the substrate has been described by way of example, but even when the ion injection area has a more complex structure, it is possible to apply the ion injection simulation method by defining the optimal reinjection start point. In the third embodiment described above, the plurality of reinjection start points are defined on the side face of the resist 12 and the side face of the trench 27, but for example, as shown in FIG. 5A, it is possible to apply the present disclosure to a case where one reinjection start point is defined on each side face.

<5. Fourth Embodiment of Ion Injection Simulation Method>

Next, a fourth embodiment of an ion injection simulation method will be described. In the first to third embodiments described above, a case where the impurity concentration distribution based on the ion injection is represented in the 2-dimensional area has been described by way of example. In the fourth embodiment, a case where the impurity concentration distribution is determined by the injection re-dispersion model ion injection simulation described in a 3-dimensional area will be described.

[3-Dimensional Shape: Flat Face]

FIG. 11A and FIG. 11B show a structure of an ion injection area applied by the ion injection simulation method of the embodiment. FIG. 11A shows an example of the concentration distribution of impurities determined by the injection re-dispersion model ion injection simulation described above in the ion injection area formed of a substrate 11 and a resist 31 formed on the substrate 11 using isopleths. FIG. 11B shows an example of a plurality of reinjection start points 32A to 32C defined on side faces 31A to 31C of the resist 31 in the structure.

In the structure shown in FIG. 11A and FIG. 11B, an exposed face from of the resist 31 of the substrate 11 is surrounded by the side face 31A, the side face 31B, and the side face 31C of the resist 31. For this reason, in this configuration, the reinjection from the side faces 31A to 31C of the resist 31 to the substrate is possible. It is possible that the reinjection doses from the side faces 31A to 31C are reinjected into the other side faces 31A to 31C again. Hereinafter, according to the flow chart shown in FIG. 4 described above, the ion injection simulation method of the fourth embodiment will be described. Even in the ion injection simulation of the 3-dimensional shape of the embodiment, the distribution function of the same analytical model as that of the ion injection simulation of the 2-dimensional shape of the first to third embodiments described above can be applied.

First, in S10, the reinjection start point of the reinjection dose is defined using the analytical model.

In S20, the reinjection start points are defined at the position where the concentration distribution is formed outside the area of the structure from the calculated impurity concentration distribution. In the configuration shown in FIG. 11A and FIG. 11B, the reinjection start points are defined on the side faces 31A, 31B, and 31C of the resist 31. Herein, as shown in FIG. 11B, a plurality of reinjection start points 32A to 32C are defined on the side faces 31A, 31B, and 31C of the resist 31, respectively.

A method of defining the reinjection start points in a 3-dimensional area will be described. Herein, as an example, a method of defining the reinjection start point 32A on the side face 31A will be described.

First, as shown in FIG. 11B, the side face 31A is divided into areas indicated by broken lines in a z-axis direction. By division in the z-axis direction as described above, the side face 31A is divided into belt-shaped areas extending in the z-axis direction. For each area divided in the z-axis direction, an area where impurities of a concentration equal to or higher than a predetermined value are disposed outside the area of the resist 31 is divided for each concentration in the y-axis direction. As described above, on the side face 31A, the center positions of the areas divided in the z-axis direction and the y-axis direction are defined as the reinjection start points 32A.

As described above, in the 3-dimensional area, the face on which the reinjection start point is defined is separated into predetermined areas to set areas in the concentration distribution, and it is possible to define the reinjection start points in the areas. By defining the reinjection start points 32A as described above, it is possible to define the plurality of horizontally and vertically arranged reinjection start points 32A on the side face 31A of the resist 31.

In the same manner as the side face 31A, the reinjection start points 32B and 32C are defined on the side face 31B and the side face 31C.

First, the side face 31B is divided into areas indicated by broken lines in the z-axis direction. The areas divided in the z-axis direction are further divided in the x-axis direction for each concentration. The center positions of the areas divided in the z-axis direction and the x-axis direction are defined as the reinjection start points 32B.

The side face 31C is divided into areas indicated by broken lines in the z-axis direction. The areas divided in the z-axis direction are further divided in the y-axis direction for each concentration. The center positions of the areas divided in the z-axis direction and the y-axis direction are defined as the reinjection start points 32C.

As described above, the plurality of horizontally and vertically arranged reinjection start points 32B and 32C are defined on the side face 31B and 31C.

On the side faces 31A, 31B, and 31C, it is preferable that the reinjection start points 32A, 32B, and 32C are at the same height (position in the z-axis direction). That is, when the areas divided in the z-axis direction are divided in the x-axis direction or y-axis direction, the x-axis and y-axis of the division are set to the same height in the side faces 31A, 31B, and 31C. Accordingly, it is possible to keep the symmetry and uniformity of the impurity concentration distribution.

Then, in S30, conversion of reinjection dose amounts D from the reinjection start points 32A, 32B, and 32C is performed.

The conversion of the reinjection dose amount D is determined from the impurity concentration distribution calculated using the analytical model in the same manner as the first embodiment and the second embodiment. From the impurity concentration distribution, impurities disposed outside the resist 31 are converted into the reinjection dose amount D for each area where the reinjection start points 32A, 32B, and 32C are defined.

Then, in S40, an angle distribution function of the reinjection dose is defined. In Step S50, an energy distribution function of the reinjection dose is defined, and the reinjection dose amount $\Delta D(\theta, E)$.

In S60, calculation of the impurity distribution based on the injection of the reinjection dose from the reinjection start point to the substrate is performed under conditions with the injection angle $\theta$ and the injection energy E for the reinjection dose amount $\Delta D(\theta, E)$.

The calculation of the impurity distribution based on the reinjection dose amount $\Delta D(\theta, E)$ is performed in order from the reinjection start points 32A, 32B, and 32C defined at the same position in the same manner as the second embodiment. The calculation of all the reinjection start points is repeated, and by completing the calculation from all the reinjection start points 32A, 32B, and 32C, it is possible to determine the impurity concentration distribution based on the injection re-dispersion model ion injection simulation.

In the configuration shown in FIG. 11A and FIG. 11B, it is possible that the reinjection dose from one side face of the resist 31, for example, the side face 31A is injected from the other side faces 31B and 31C of the resist 31 as well as the substrate 11. For this reason, the calculation of the impurity distribution based on the reinjection dose amount $\Delta D(\theta, E)$ is performed from the reinjection start points 32A, 32B, and 32C defined at high positions of the resist 31. At the reinjection start points 32A, 32B, and 32C at positions lower than this, the reinjection dose amount $\Delta D(\theta, E)$ is determined in addition to the reinjection dose from the reinjection start points 32A, 32B, and 32C at high positions to calculate the impurity distribution.

[Modified Example: 3-Dimensional Shape: Curved Face]

In the embodiment described above, the side face of the resist is a flat face and the ion injection area of the substrate is surrounded by the flat face, but it is possible to apply the injection re-dispersion model ion injection simulation described above even when the side face of the resist is a curved shape.

Figure 12A:
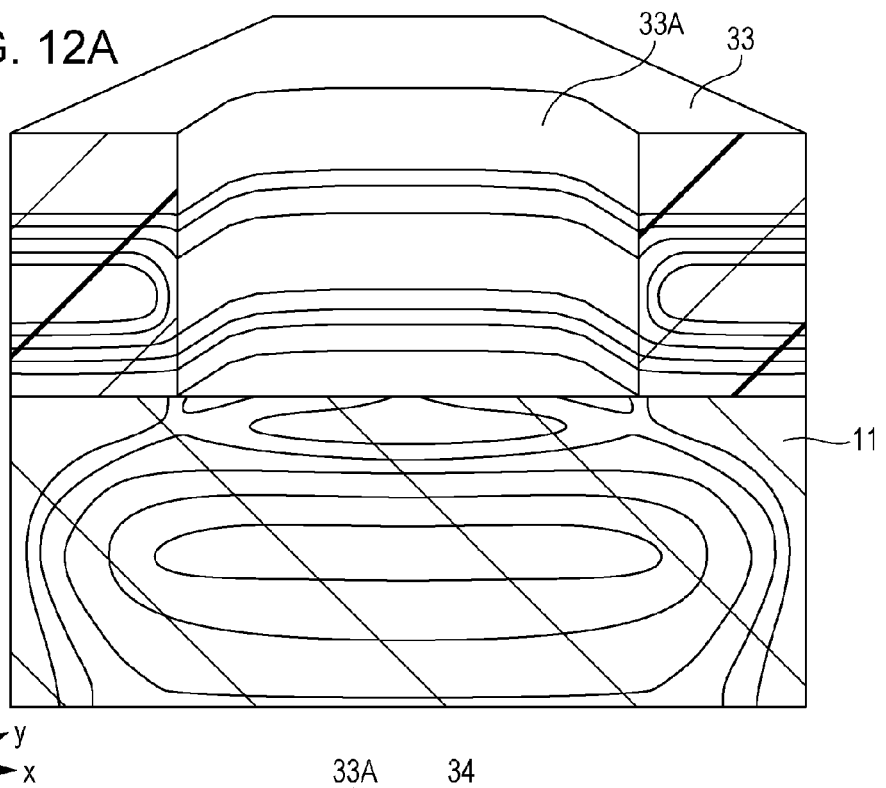
FIG. 12A is a diagram illustrating impurity concentration distribution based on ion injection simulation.
Figure 12B:
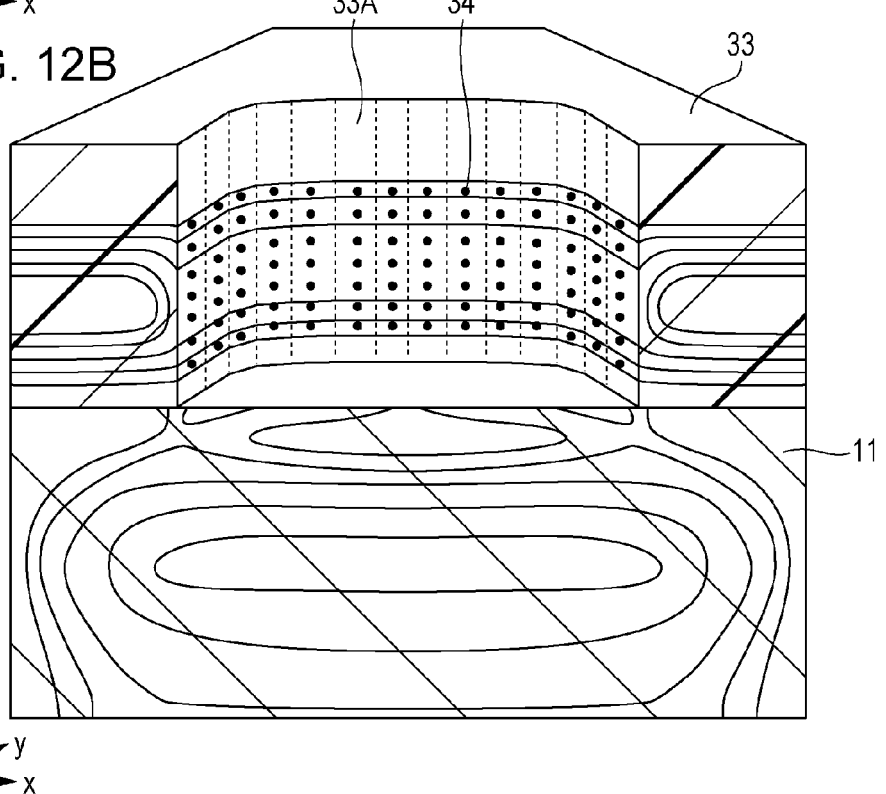
FIG. 12B is a diagram illustrating a reinjection start point based on ion injection simulation.

FIG. 12A and FIG. 12B show a structure of an ion injection area applied to the ion injection simulation when the side face of the resist is formed of a curved face.

FIG. 12A shows an example of concentration distribution of impurities determined by the injection re-dispersion model ion injection simulation described above in the ion injection area configured by a substrate 11 and a resist 33 formed on the substrate 11. FIG. 12B shows an example of a plurality of reinjection start points 34 defined on the side face 33A of the resist 33 in the structure.

In the structure shown in FIG. 12A and FIG. 12B, an exposed face from the resist 33 of the substrate 11 is surrounded by the side face 33A of the resist 33. For this reason, in this configuration, the reinjection from the side face 33A of the resist 33 to the substrate is possible. It is possible that the reinjection dose from the side face 33A is reinjected into the other position of the side face 33A again.

Hereinafter, according to the flowchart shown in FIG. 4 described above, the ion injection simulation method of the fourth embodiment will be described. The modified example of the embodiment may be performed in the same manner as the fourth embodiment described above, except for the method of defining the reinjection start points on the side face 33A of the resist 33.

First, in S10, the reinjection start point of the reinjection dose is defined using the analytical model. Then, in S20, the reinjection start points are defined at the position where the concentration distribution is formed outside the area of the structure from the calculated impurity concentration distribution. In the configuration shown in FIG. 12A and FIG. 12B, the reinjection points 34 are defined on the side face 33A of the resist 33. The reinjection start points 34 are defined as follows.

First, as shown in FIG. 12B, the whole face of the side face 33A of the resist 33 is divided into an area indicated by broken lines in the z-axis direction, and the side face 33A is divided into belt-shaped areas extending in the z-axis direction. For each area divided in the z-axis direction, an area where impurities of a concentration equal to or higher than a predetermined value are disposed outside the area of the resist 33 is divided for each concentration in a direction parallel to the x-y plane. As described above, on the side face 33A, the center positions of the areas divided in the z-axis direction and the x-y plane direction are defined as the reinjection start points 34.

By such a method, even when the side face 33A of the resist 33 is formed of a curved face, it is possible to define the plurality of horizontally and vertically arranged reinjection start points 34.

Then, in S30, conversion of the reinjection dose amount D from the reinjection start point 34 is performed. Then, in S40, an angle distribution function of the reinjection dose is defined, in S50, an energy distribution function of the reinjection dose is defined, and the reinjection dose amount $\Delta D(\theta, E)$ is determined.

In S60, calculation of the impurity distribution based on the injection of the reinjection dose from the reinjection start point to the substrate is performed under conditions with the injection angle $\theta$ and the injection energy E for the reinjection dose amount $\Delta D(\theta, E)$.

The calculation of the impurity distribution based on the reinjection dose amount $\Delta D(\theta, E)$ is performed in order from the reinjection start points defined at the same position in the same manner as the second embodiment. The calculation of all the reinjection start points 34 is repeated, and by completing the calculation from all the reinjection start points 34, it is possible to determine the impurity concentration distribution based on the injection re-dispersion model ion injection simulation.

In addition, it is possible to perform design of the semiconductor device on the basis of the ion injection simulation described above. It is possible to produce the semiconductor device according to the design. The influence of the well proximity effect is predicted in advance by the simulation described above, and it is possible to optimize the ion injection in the design and production processes of the semiconductor device.

According to the ion injection simulation method of the fourth embodiment and the modified example, it is possible to apply the injection re-dispersion model ion injection simulation to the structure of a 3-dimensional area. According to the method, it is possible to apply the simulation based on the injection re-dispersion model to the simulation of a 3-dimensional area performed in the actual design of a semiconductor device. As a result, even in a 3-dimensional simulation, it is possible to acquire the impurity concentration distribution in a micro-structure which is easily affected by the well proximity effect, by simulation using the analytical model.

In the embodiment described above, only reinjection from the resist is considered as a 3-dimensional shape, but the present disclosure may be applied to a case where a structure such as the trench described in the third embodiment is formed on the substrate.

In the second to fourth embodiments, as the structure on which the reinjection start points are defined, a case where the reinjection start points are arranged horizontally and vertically on the side face of the resist and the side face of the trench has been described, but the present disclosure may be applied to a case where one reinjection start point is defined in a longitudinal direction (height direction). In this case, the reinjection start point may be defined in the same manner as the case shown in FIG. 5A described above. The side face of the structure on which the reinjection start point is defined may be perpendicular to the face of the substrate, and may be a shape in which a plurality of faces such as an inclined face and a curved face are combined. The side face of the structure is not limited to a flat face, and may be a curved face or a shape combining a flat face and a curved face.

In the embodiment described above, a method of defining the reinjection start points is described in detail, but the method of defining the reinjection start points is not limited to the method described above, and irrespective of whether there is a single or a plurality, the reinjection start points may be defined by the optimal method according to the structure of the ion injection area or the conditions of the ion injection.

<6. Embodiment of Ion Injection Simulation Device>

Figure 7:
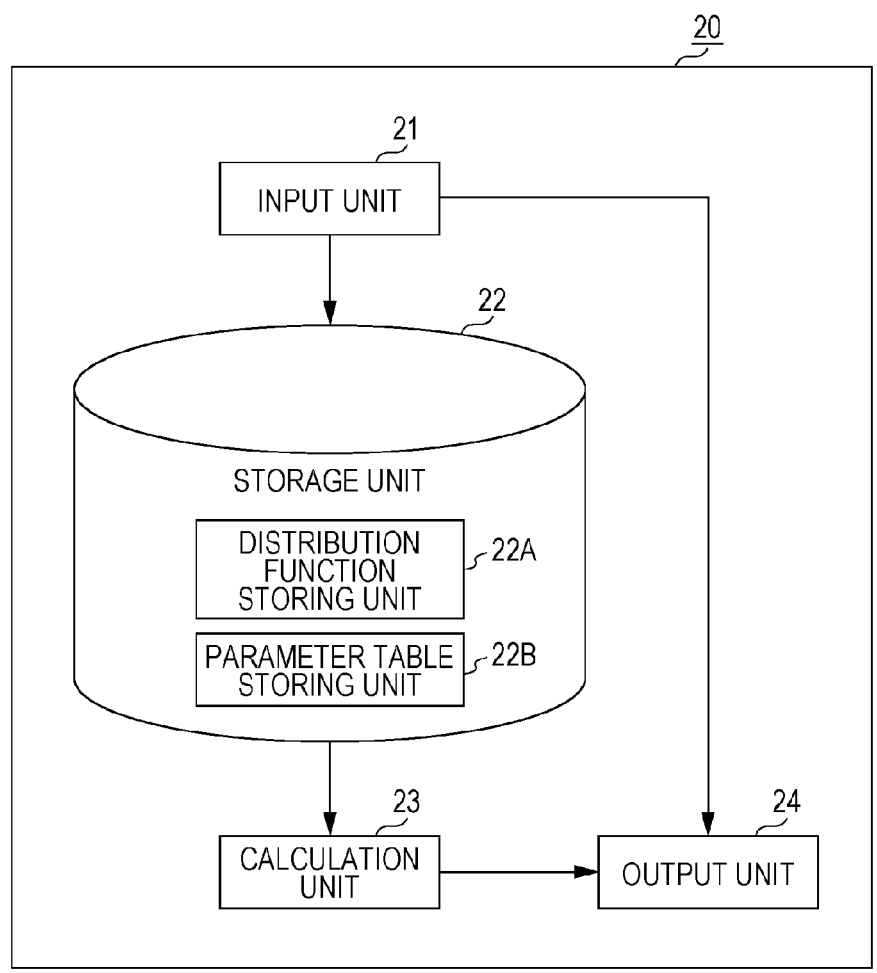
FIG. 7 is a diagram illustrating a configuration of an ion injection simulation device.

Next, an embodiment of a simulation device performing the simulation of the injection re-dispersion model described above will be described. FIG. 7 shows a configuration of an ion injection simulation device 20 of the embodiment.

The ion injection simulation device 20 includes a storage unit 22 that stores input information, and a calculation unit 23 that reads the information from the storage unit 22 and performs calculation. In addition, the ion injection simulation device 20 includes an input unit 21 that is provided to input data necessary for simulation, and an output unit 24 that displays the calculation result of the calculation unit 23 and outputs the input data.

When the ion injection simulation is performed, the injection conditions are input directly through the input unit 21 or as a file which can be recognized by the ion injection simulation device. The input injection conditions are stored in the storage unit 22 formed of a memory, a HDD, or the like.

The storage unit 22 is formed of, for example, a distribution function storing unit 22A and a parameter table storing unit 22B.

The distribution function storing unit 22A stores information of the distribution function used in the analytical model of the ion injection, for example, a Gaussian function, a half-Gaussian function, a Pearson IV function, or a dual-Pearson function.

The parameter table storing unit 22B stores various parameters corresponding to the distribution function. For example, the parameter table storing unit 22B stores a parameter table regulated according to injection conditions such as a dose amount, a tilt angle, a twist angle, a through-film thickness.

The calculation unit 23 calculates the concentration distribution of the impurities ion-injected into the substrate and the resist using the distribution function and the parameters stored in the storage unit 22, and calculates the concentration distribution of the impurities reinjected from the resist into the substrate on the basis of the injection re-dispersion model described above.

For example, parameters based on each condition of the injection angle distribution at the time of ion injection are extracted from the parameter table storing unit 22B. The distribution function is read from the distribution function storing unit 22A, the parameters are substituted for the distribution function, and the concentration distribution of impurities injected into the substrate and the resist is calculated.

Using the diffusion of the impurities in the resist, the reinjection dose amount D of impurities disposed outside the area is calculated.

In the reinjection dose, the parameters are read from the parameter storing unit 22B, the angle distribution function of the reinjection dose, the energy distribution function, and the reinjection start point are defined. The concentration distribution of the reinjection dose in the substrate is calculated from the defined distribution function.

The information input from the input unit 21 and the result of the ion injection simulation are displayed by the output unit 24. The output unit 24 is formed of an output device such as a display device or a printer device.

By using the injection re-dispersion model in which it is thought that among the impurities ion-injected into the resist described above the impurities disposed outside the area of the resist should be reinjected into the substrate, it is possible to perform the ion injection simulation of the well proximity effect using the analytical model.

Generally, when a simulation with the same injection conditions is performed in the analytical model and the Monte Carle method, there is a calculation time difference of about 10 times. In the simulation of the analytical model using the injection re-dispersion model described above, the time difference is not drastically reduced. For this reason, it is possible to drastically raise the speed of the simulation of the well proximity effect as compared with the related art.

In addition, the present disclosure may have the following configurations.

(1) An ion injection simulation method including: calculating a reinjection dose reinjected from a side face of a structure to a substrate after being injected into the substrate and the structure formed on the substrate; and calculating concentration distribution of impurities injected into the substrate from a distribution function and the reinjection conditions of the reinjection dose.

(2) The ion injection simulation method according to (1), wherein concentration distribution of impurities in the substrate or the structure is calculated from the ion injection conditions of the substrate and the structure, and a reinjection dose amount injected into the substrate is calculated from the reinjection dose disposed outside an area by a transverse distribution of impurities in the substrate or the structure.

(3) The ion injection simulation method according to (2), wherein a reinjection start point is defined on the side face and the reinjection dose amount reinjected from the reinjection start point into the substrate is calculated.

(4) The ion injection simulation method according to (2) or (3), further including: setting a reinjection angle of the reinjection dose using the distribution function; and dividing the reinjection dose amount for each reinjection angle.

(5) The ion injection simulation method according to any one of (2) to (4), further including: setting a reinjection energy of the reinjection dose using the distribution function; and dividing the reinjection dose amount for each reinjection energy.

(6) The ion injection simulation method according to any one of (1) to (5), further including: dividing the reinjection dose amount for each reinjection angle using the distribution function and then dividing the reinjection dose amount for each reinjection energy; or dividing the reinjection dose amount for each reinjection energy using the distribution function and then dividing the reinjection dose amount for each reinjection angle.

(7) The ion injection simulation method according to any one of (3) to (6), wherein the reinjection dose is calculated in order from the reinjection start point defined at a high position in a direction perpendicular to a face of the substrate.

(8) An ion injection simulation device including: a storage unit that stores a distribution function and parameters; and a calculation unit that calculates concentration distribution, in a substrate, of impurities reinjected from a side face of a structure into a substrate in the substrate after being injected into the structure formed on the substrate and using the distribution function and the parameters stored in the storage unit.

(9) A method of producing a semiconductor device, the method including: forming a pattern of a structure on a semiconductor substrate; and injecting ions from the structure to the semiconductor substrate. In the ion injection process, simulation based on the ion injection simulation method according to any one of (1) to (7), and ion injection is performed on the semiconductor substrate on the basis of the conditions generated by the ion injection simulation.

(10) A method of designing a semiconductor device, wherein concentration distribution of impurities of the semiconductor substrate is calculated by the ion injection simulation method according to any one of (1) to (7).

The present disclosure contains subject matter related to that disclosed in Japanese Priority Patent Application JP 2011-054703 filed in the Japan Patent Office on Mar. 11, 2011 and Japanese Priority Patent Application JP 2011-286252 filed in the Japan Patent Office on Dec. 27, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An ion injection simulation method comprising the steps of:
    calculating an impurity concentration distribution based on a distribution function of an initial impurity injection into a substrate and a structure on the substrate; and
    calculating a reinjection dose for reinjection into a side face of the structure on the substrate after the initial impurity injection based on the impurity concentration distribution; and
    re-calculating the impurity concentration distribution based on the distribution function of the initial impurity injection and the reinjection dose.

2. The ion injection simulation method according to claim 1, wherein the impurity concentration distribution in the substrate or the structure is calculated from the initial impurity injection into the substrate and the structure, and the reinjection dose is calculated from the impurity concentration distribution disposed outside an area on the side face of the structure by a transverse distribution of impurities in the substrate or the structure.

3. The ion injection simulation method according to claim 2, further comprising the steps of:
    setting a reinjection start point on the side face, and
    calculating the reinjection dose from the reinjection start point.

4. The ion injection simulation method according to claim 3, wherein the reinjection dose is calculated in order from the reinjection start point defined at a high position in a direction perpendicular to a face of the substrate.

5. The ion injection simulation method according to claim 2, further comprising the step of:
    setting a reinjection angle of the reinjection dose using the distribution function; and dividing the reinjection dose into an amount corresponding to the reinjection angle.

6. The ion injection simulation method according to claim 2, further comprising the steps of:
setting a reinjection energy of the reinjection dose using the distribution function; and
dividing the reinjection dose into an amount corresponding to the reinjection energy.

7. The ion injection simulation method according to claim 2, further comprising the steps of:
dividing the reinjection dose amount for the reinjection angle using the distribution function and then dividing the reinjection dose amount for the reinjection energy; or
dividing the reinjection dose amount for the reinjection energy using the distribution function and then dividing the reinjection dose amount for the reinjection angle.

8. An ion injection simulation device comprising:
a storage unit configured to store a distribution function and parameters; and
a calculation unit configured to calculate a reinjection dose into a side surface of a structure based on an impurity concentration injected into a substrate and the structure on the substrate using the distribution function and parameters of the impurity concentration.

9. A method of producing a semiconductor device, the method comprising the steps of:
forming a pattern of a structure on a semiconductor substrate; and
injecting ions from the structure to the semiconductor substrate,
wherein,
the injecting ion step further comprises(a) an impurity concentration distribution calculated based on a distribution function of an initial impurity injection into a substrate and a structure on the substrate; and (b) a reinjection dose for reinjection into a side face of the structure on the substrate after the initial impurity injection calculated based on the impurity concentration distribution.

10. A method of designing a semiconductor device, the method comprising the steps of:
calculating an impurity concentration distribution based on a distribution function of an initial impurity injection into a substrate and a structure on the substrate; and
calculating a reinjection dose for reinjection into a side face of the structure on the substrate after the initial impurity injection based on the impurity concentration distribution; and
re-calculating the impurity concentration distribution based on the distribution function of the initial impurity injection and the reinjection dose
calculating a reinjection dose from a distribution function of an impurity concentration injected into a substrate and a structure on the substrate; and.

* * * * *